United States Patent
Pillion et al.

(10) Patent No.: US 6,617,079 B1
(45) Date of Patent: Sep. 9, 2003

(54) PROCESS AND SYSTEM FOR DETERMINING ACCEPTIBILITY OF A FLUID DISPENSE

(75) Inventors: John E. Pillion, Brookline, NH (US); Robert McLoughlin, Pelham, NH (US); Jieh-Hwa Shyu, Andover, MA (US)

(73) Assignee: Mykrolis Corporation, Billerica, MA (US)

( * ) Notice: Subject to any disclaimer, the term of this patent is extended or adjusted under 35 U.S.C. 154(b) by 0 days.

(21) Appl. No.: 09/597,331

(22) Filed: Jun. 19, 2000

(51) Int. Cl.⁷ ............................ G03F 7/16; B05B 12/00; G05B 1/11; B05C 11/08; B05C 11/10; G01F 3/00
(52) U.S. Cl. .................. 430/3; 430/272.1; 430/30; 430/327; 427/8; 427/10
(58) Field of Search ............... 430/30, 272.1, 430/327, 3; 427/8, 10

(56) References Cited

U.S. PATENT DOCUMENTS

| | | | | |
|---|---|---|---|---|
| 5,559,339 A | * | 9/1996 | Doumanik et al. | 73/861.41 |
| 5,666,325 A | * | 9/1997 | Belser et al. | 367/95 |
| 6,024,249 A | * | 2/2000 | On | 222/52 |
| 6,173,864 B1 | * | 1/2001 | Reighard et al. | 222/55 |

FOREIGN PATENT DOCUMENTS

| | | |
|---|---|---|
| JP | 01021924 | 5/1989 |
| JP | 04158510 | 9/1992 |
| JP | 06304518 | 3/1995 |
| JP | 2000-42472 A * | 2/2000 |
| JP | 2000042472 | 2/2000 |
| WO | WO 98/00736 | 1/1998 |

OTHER PUBLICATIONS

Krishna et al, 130:146041 CA, Abstract of Proc. SPIE–Int. Soc. Opt. Eng (1998), 3333 (Pt 2, Advances in Resist Technology and Processing XV, 1323–1336 (2 pages).*

* cited by examiner

Primary Examiner—Cynthia Hamilton
(74) Attorney, Agent, or Firm—Mykrolis Corporation; Timothy J. King; Paul J. Cook

(57) ABSTRACT

A process and system are provide for determining the acceptability of a fluid dispense such as a discrete volume of fluid used to coat a substrate. The fluid dispense is exposed to an energy source and the energy transmitted by the fluid dispense is detected to determine the shape of the fluid dispense. The fluid dispense shape and the timing of the beginning and end of the dispense are compared to previously generated standard dispense profiles and used to determine the acceptability of the shape and/or timing of the fluid dispense. The output from the sensor is used to control further processing of the substrate.

24 Claims, 7 Drawing Sheets

PROCESS AND SYSTEM FOR DETERMINING ACCEPTIBILITY OF A FLUID DISPENSE

BACKGROUND OF THE INVENTION

1. Field of Invention

This invention relates to a method and apparatus for monitoring the integrity and timing of a fluid dispense. More particularly, the present invention relates to a method and apparatus for monitoring the integrity of a fluid dispense in real time.

2. Description of the Prior Art

A variety of industries require the delivery of precise volumes of a liquid at a consistent rate for highly repeatable periods of time. Furthermore, at the end of a delivery, subsequent processing will occur whose timing with respect to the delivery is crucial for process consistency and product uniformity. For example, precise volumes of a photoresist composition are delivered to a silicon wafer substrate in order to form a photoresist layer of uniform thickness onto the wafer. The wafer is spun at high speeds following the liquid delivery to evenly distribute the liquid on the wafer. The requirement for precise volumes, duration of dispense, and rate of delivery must be affected by an apparatus which is delivering the same volumes of liquid repeatedly at a consistent delivery rate for a highly repeatable duration over long periods of time.

As the semiconductor industry expects to utilize submicron technology, photo resists and low dielectric liquid compositions are becoming increasingly important for improving the performance of microprocessor and memory storage devices. To reduce manufacturing costs and reduce photoresist waste, lower dispense amounts of liquid photoresist and lower viscosity of liquid will be dispensed. Coatings on the wafer of these fluids require a high degree of uniformity in the thickness across the wafer and also the thickness from wafer to wafer. In order to attain the required uniformity and high manufacturing yield of films formed from these fluids, the fluid dynamics and timing of the liquid dispensed onto the wafer are critical. For example, broken streams of liquid impinging on the wafer, caused by drops or air bubbles in the dispense nozzle or tubing, are common causes of wafer defects which effect the uniformity of the film formed from the liquid. Increase defects lead to undesirable increases in production costs.

Fluids dispensed onto a wafer are made into a uniform film on the wafer by spinning the wafer at low speeds as the fluid is dispensed and then increasing the spinning speed, a step called spin up, to a final spin speed to uniformly spread the liquid across the wafer and to cause evaporation of the photoresist or low K dielectric solvent. The time during which the wafer is at its final spin speed is crucial to forming reproducibly thick and uniform coatings. Knowing the time between the end of a fluid dispense, when the liquid leaves the nozzle, and the time to final spin up is important for controlling the time the wafer is spun at the high spin speed and thus effects coating uniformity. The importance of various variables on coating uniformity is described by Daughton and Givens in *J. Electrochem. Soc.,* (1992), vol. 129, p 173.

It has been proposed in PCT application number 98/00736 to provide and electronic rain gauge. A container is provided for collecting rain water and converting the collected water into drops of defined volume through an orifice. The volume of rain is determined by counting the drops of liquid from the collector. This is accomplished by an optical emitter and optical receiver pair such that when the liquid drop passes between the emitter and receiver a voltage change or pulse is produced. By counting the number of voltage pulses and multiplying by the volume of a drop, the total amount of precipitation can be determined. No means is provided for monitoring the shape of the drop, its time leaving the apparatus, nor are means provided for detecting irregularities, the shape of the drop, or integrating the output signal from the emitter sensor pair as an input signal into a wafer spin coater or to the fluid dispense pump. In contrast, when monitoring a liquid dispense onto a silicon wafer, it is necessary to provide a means for monitoring the dispense in a manner that is capable of determining that the dispense is applied to each wafer in a consistent manner including the time of the dispense, shape of the dispense fluid, as well as determining the dispense volume. This requirement renders it necessary to monitor the shape and timing of the fluid dispense so that the rate of fluid application to the substrate from initial contact, intermediary contact and final contact between the fluid and substrates can be essentially duplicated over an extended period of time.

Accordingly, it would be desirable to provide a method and apparatus for monitoring the delivery of precise volumes of liquid with repeatable rates, fluid dynamics, volumes, and intervals of delivery. In addition, it would be desirable to provide such a method and apparatus which is capable of monitoring the delivery of precise volumes of liquid at repeatable rates over extended times, in a production line on a real time basis and using that information for process control.

SUMMARY OF THE INVENTION

In accordance with this invention, a time dependent profile of the dynamics of a liquid being dispensed from a nozzle is generated and analyzed. The profile thus generated then is compared to a standard profile that correlates in time, volume, and profile to a satisfactory liquid dispense. When the profile which is generated is deemed to be satisfactory in volume, timing, and shape, further processing of the liquid dispensed onto a substrate such as a silicon wafer is continued to effect further treatment of the liquid coated substrate. A light generator and a light detector are mounted below the nozzle from which the liquid is dispensed and the light generator and light detector are positioned on opposite sides of the path of liquid dispense flow. It is to be understood that other forms of energy from a generator, including but not limited to thermal, acoustic, or other types of electromagnetic energy can also be used in conjunction with a suitable detector. Thermal energy emitted from the sample itself can also be considered as a source of energy for a suitable detector. While light energy will be used as an example for description of this invention it is understood that these other types of energy and sensors could be used interchangeably.

During the dispensing process, the liquid stream will absorb or scatter some of the light from the light generator while the light transmitted from or scattered through the liquid is collected by the detector. The amount of light transmitted from the stream, whetther it be absorbed or scattered, depends upon the diameter and the continuity of a given liquid stream emanating from the fluid dispense nozzle. As the rate the liquid is dispensed changes or stops, the diameter of the liquid stream reduces and breaks and the amount of light that reaches the detector is increased. By recording the amount of light collected over the time and converting that measurement to a suitable electrical signal, the time dependent profile, the fluid dynamics, of the dispense is obtained. This signal is then compared to a previously generated standard signal for a satisfactory liquid dispense to determine the acceptability of the dispense for its intended purpose. Alternatively, the signal obtained from the sensor can be used to define the timing of the dispense and end of dispense, and be used to start subsequent fluid processing steps such as spin-up or the application of a reduced pressure to the chamber.

In accordance with this invention, a process and system are provided for monitoring the light or energy transmission characteristics of a fluid dispense and correlating the monitored characteristics with a previously generated standard dispense to determine whether the fluid dispense is satisfactory for a particular purpose such as for a coating on a substrate. Also provided by this system is a means to determine the time at which the last fluid has left the dispense nozzle and to use the signal provided to initiate subsequent processing steps. A fluid is dispensed from a nozzle and is passed through at least one detector set, each comprising an energy emitter and an energy detector. As an example, the photons from an emitter pass through the fluid dispense and the photons transmitted through the fluid dispense are detected by the detector. A graph correlating degree of photon transmission over time then is compared to the standard graph to determine whether the dispense is satisfactory. The entire volume of dispense is exposed to the emitted photons so that the graph characterizes the entire dispense. When the dispense is deemed satisfactory, the coating process or the like in which the dispense is used, such as spin-up, is allowed to continue. When the dispense is deemed unsatisfactory, the object of the dispense is removed from further processing. For example, when coating a silicon wafer with a photoresist or low K dielectric or other material, the wafer coated with an unsatisfactory dispense is removed from further processing and the dispense fluid is removed there from such as by solvent extraction. In this example, substantial economic savings are realized by permitting recovery of acceptable untreated wafers that would become unacceptable if processed further such as when unsatisfactory photo-processing of the coated wafer is effected.

An alternative embodiment of this invention would measure the energy reflected or scattered from the substrate through at least one detector set, each comprising an energy emitter and an energy detector. The energy from the emitter strikes the fluid dispensed onto the substrate and the energy reflected from the fluid dispensed on the substrate is detected by the detector. A graph correlating degree of energy scattering over time then is compared to the standard graph to determine whether the dispense is satisfactory. The wafer is exposed to the emitted energy so that the graph of the scattered or reflected energy characterizes the entire dispense onto the wafer.

DESCRIPTION OF SPECIFIC EMBODIMENTS

A satisfactory fluid dispense is one which is formed from a single discrete volume of fluid rather than a plurality of discrete volumes of fluid. When a plurality of discrete fluid volumes are dispensed, the resultant coating on the substrate is characterized by a more variable thickness or striations as compared to the uniform coating generated with a single discrete fluid volume. Accordingly, a signal response generated by a single discrete volume of fluid passing through the sensor device is characterized by a smooth curve between the initial point of measurement where no fluid is interposed between the photon emitter and the photon detector and the final point of measurement where no fluid is interposed between the photon emitter and the photon detector. In contrast, a curve generated by a plurality of discrete fluid volumes is characterized by at least one peak or depression for the period of time that little or no fluid is present between discrete fluid volumes. A peak is obtained when energy transmission is directly measured while a depression is obtained when the inverse of photon transmission is measured.

One or a plurality of energy detectors can be utilized. When a plurality of detector sets are employed, they are positioned spaced apart from each other along the travel path of the fluid dispense. It is possible to use two or three detector sets in order to provide a means for verifying an initial measurement. Alternatively, detector and emitter sets can be positioned around the fluid dispense nozzle and angled such that the detector measures energy reflected or scattered from the dispense volume or from the substrate coated with a portion of the fluid.

Figure 1:
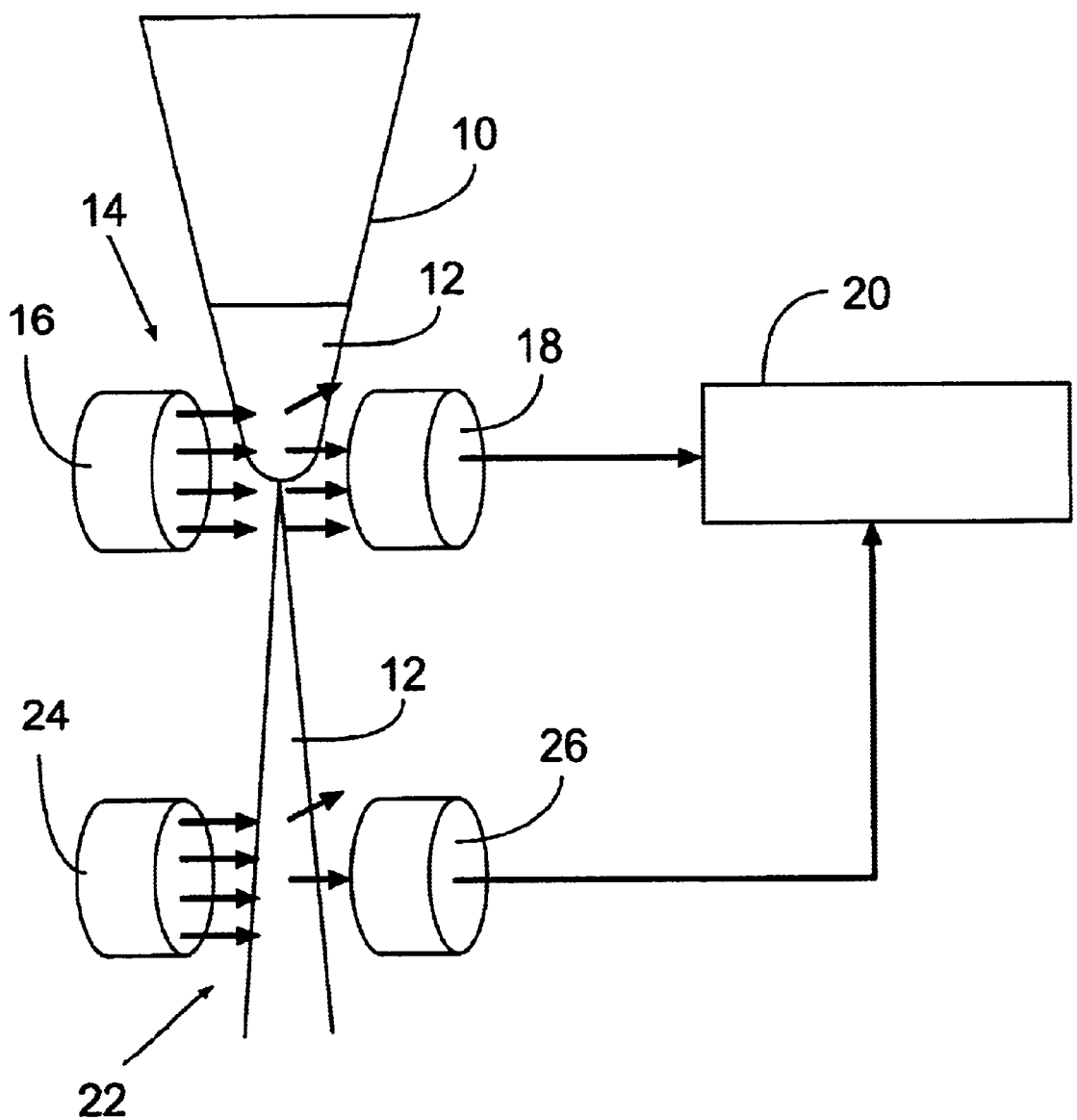
FIG. 1 is a schematic view illustrating the apparatus of this invention.

Referring to FIG. 1, the system of this invention includes a nozzle 10 connected to a container (not shown) for a fluid to be dispensed from the nozzle by any conventional means such as by gravity, applying pressure to the fluid, pumping the fluid or the like with suitable conventional valving. The dispensed fluid 12 is passed, such as by gravity between a first detector set 14 which comprises an energy emitter 16 such as an infrared or visible light emitting diode or an acoustic wave generator, and an energy detector 18 such as a photo-transistor, photo-resistor, thermopile, charge coupling device, or microphone. The detector 18 is electrically connected to a conventional signal processor 20 which is capable of generating a graph of energy transmission or energy absorbed by the liquid dispensed over a period of time. A second emitter and detector set 22 that comprises of an energy emitter 24 and energy detector 26 is positioned downstream of the first detector set 14. The energy detector 26 is electrically connected to the conventional signal processor 20 which is capable of generating a second graph of photon transmission or photon absorbance by a second drop of the dispensed fluid 12 over time.

Figure 2:
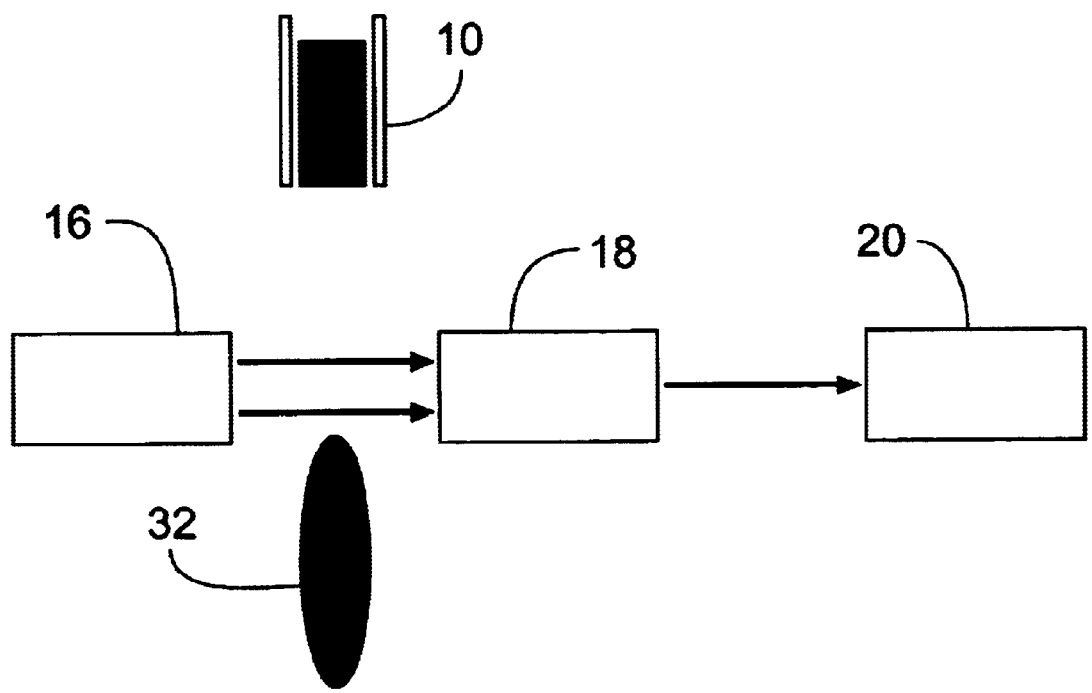
FIG. 2 illustrates a satisfactory dispense measured by the apparatus of this invention.
Figure 4A:
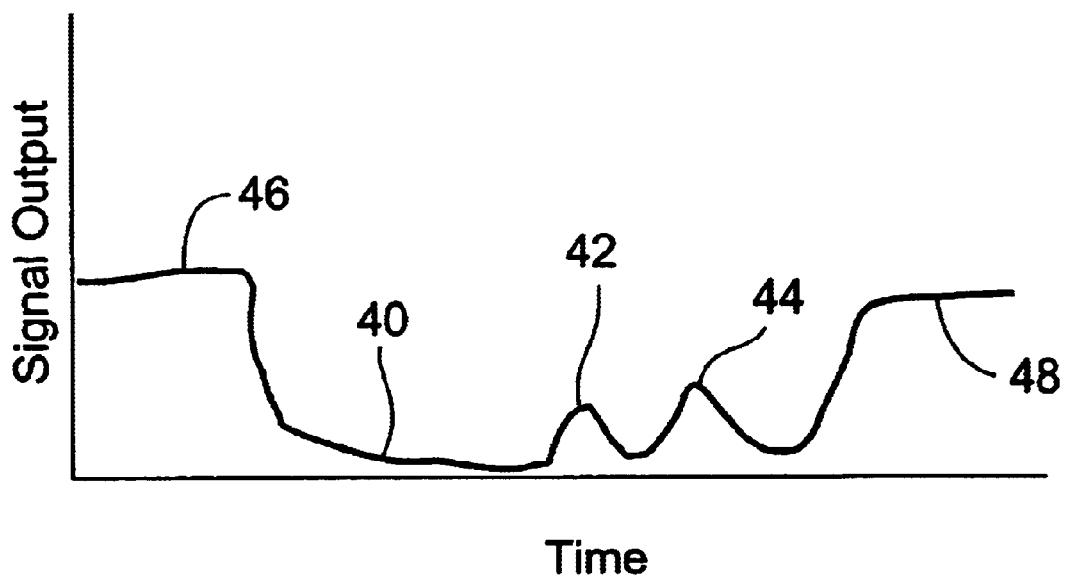
FIG. 4a is a diagram of the signal output produced by the apparatus of this invention which is representative of an unsatisfactory dispense identified in accordance with this invention.
Figure 4B:
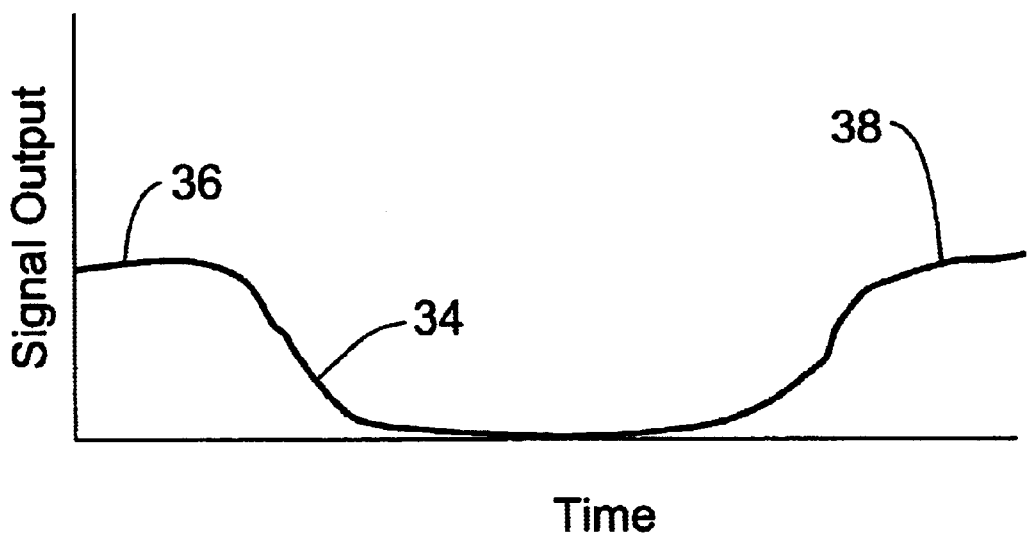
FIG. 4b is a diagram of the signal output produced by the apparatus of this invention which is representative of a satisfactory dispense identified in accordance with this invention.

Referring to FIG. 2, a satisfactory dispense is illustrated which comprises a single discrete volume 32 passing between detector 18. This satisfactory dispense causes signal processor 20 to generate a curve 34 illustrated in FIG. 4b. The curve 34 id free of spikes or depressions between the initial measurement by detector 18 where no dispense is positioned between emitter 16 and detector 18 and the final measurement 38 by detector 18 where no dispense is positioned between photon emitter 16 and detector 18.

Figure 3:
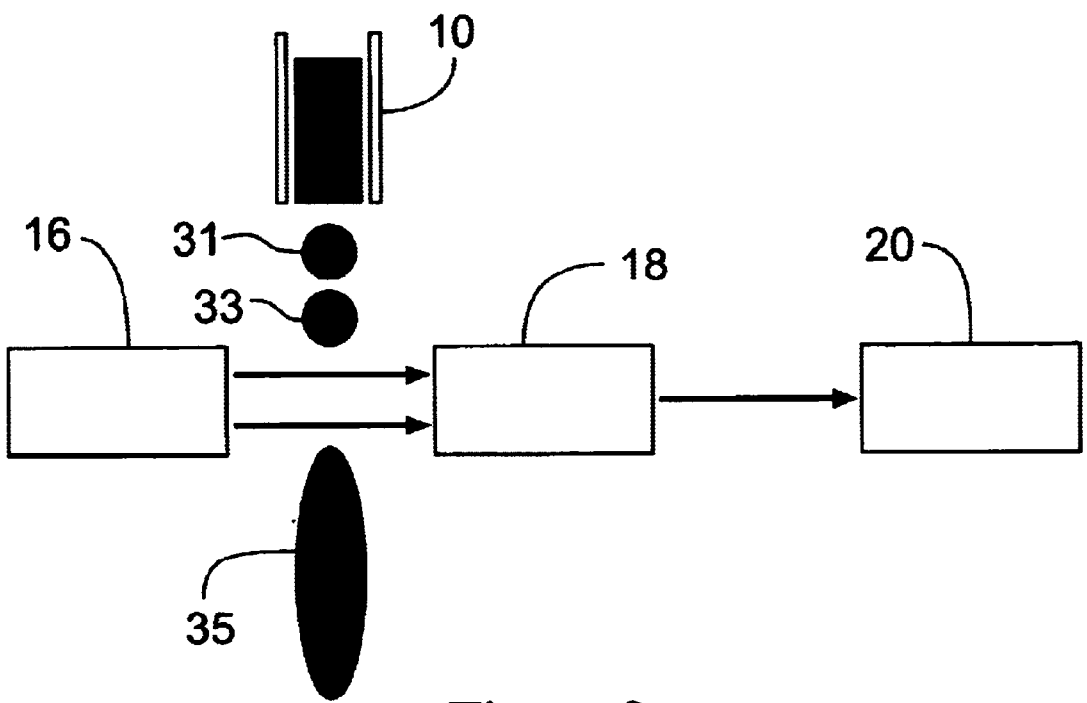
FIG. 3 illustrates an unsatisfactory dispense measured by the apparatus of this invention.

Referring to FIG. 3, an unsatisfactory dispense is illustrated which comprises a plurality of discrete volumes 31, 33, and 35 passing between emitter 16 and detector 18. This unsatisfactory dispense causes signal processor 20 to generate a curve 40 illustrated in FIG. 4a. The curve 40 includes spikes 42 and 44 (or depressions) between the initial measurement 46 by detector 18 where no dispense is positioned between emitter 16 and detector 18 and the final measurement 48 by detector 18 where no dispense is positioned between emitter 16 and detector 18. The spikes 42 and 44 comprise measurements when discrete volumes 33 and 31 respectively pass between emitter 16 and detector 18.

Figure 5:
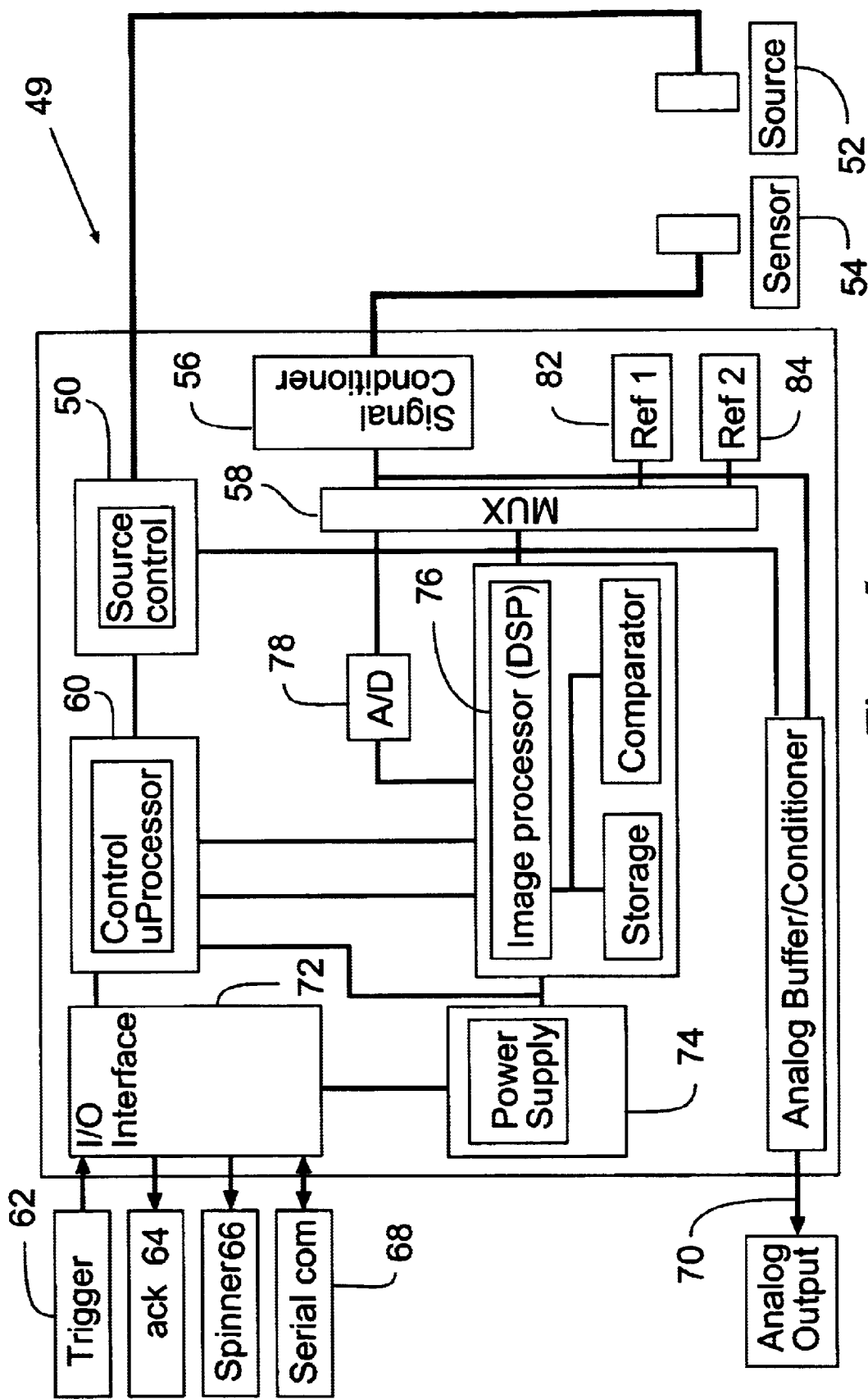
FIG. 5 is a circuit diagram for converting detected light transmitted through a dispense to a real time graph of the dispense light transmitting characteristics.

Referring to FIG. 5, a schematic diagram of a processor 49 capable of detecting the signal from the sensor, processing the signal into a suitable form, comparing the signal to a suitable dispense and signaling process equipment to become activated based on the results of the comparison, is illustrated. The source control 50 controls the source power or current to maintain a constant level applied to the source 52 of the sensor 54. This arrangement can be used to compensate for different fluid characteristics and for changing dispense requirements. The signal conditioner changes the signal from the sensor 54 such as with filters, amplifiers or the like so that signal amplitude, phase or time constant can be changed separately or together to obtain a desired signal profile. The multiflex 58 allows for multiple input voltages other than the desired sensor signal to effect calibration or control functions. The control processor 60 controls all interfaces between the processor 49 and apparatus connected to the processor 49, including the trigger 62 which functions to start to record and analyze functions as a multiple or single input, ack 64 which functions as signal support equipment of a problem or task complete as a multiple or single output, spinner 66 which functions to spin a wafer serial completion indicator 68 and analog output 70 which functions to indicate to the wafer spin control that the dispense is complete and that high spin can begin. The input-output interface 72 allows for a hardware connection to the track or other support equipment for communications via RS232 system status. The power supply 74 converts incoming voltage to the internal required voltage such as +/−15 VDC. The signal processor 76 obtains real time signal from the analog to digital converter 78 and runs the algorithms required for the determination of fluid dispense quality. This data also can be stored for fixture retrieval and analysis. The real time data also can be used as the control signal for closed loop control of the dispense. ref-1 82 and ref-2 84 can be used for calibration and run compensation for environmental changes such as temperature.

EXAMPLE 1

A light emitter and light detector pair for sensing fluid dispense was constructed. An emitter detector pair, Tandy part number 276-142, was connected with 468 ohm resistors attached to the emitter and sensor leads. The emitter's peak wavelength was 915 nm. The emitter and sensor were cut and separated by 0.8 cm and mounted on a breadboard. The device was 2"×2" in size. The liquid to be monitored was dispensed from a Millipore Intelligen™ pump. The liquid contained photoresist dissolved in an ethyl lactate based solvent. The resist was dispensed by the pump through the sensor and emitter pair, mounted on the breadboard, and was collected in a 50 ml flask on an electronic scale. Mass measurements for the dispensed liquid were made after each dispense by mass difference to the previous dispense. The 0–5 volt output from the sensor was measured by a Kipp and Zonen strip chart recorder with the chart speed set for 20 mm/sec.

Figure 6:
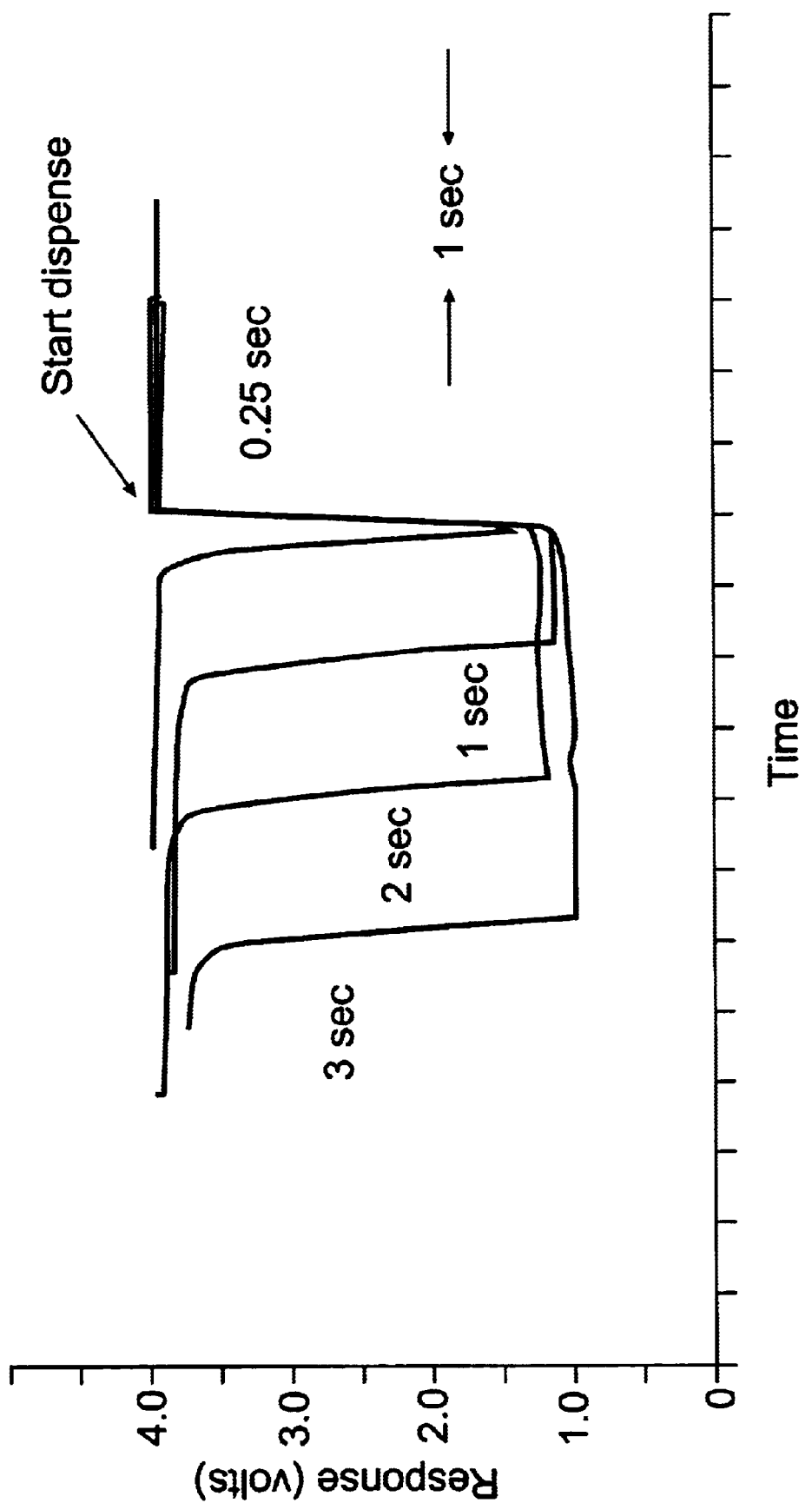
FIG. 6 show an example of a suitable dispense, for duration of 0.25 to 3 seconds, as measured by the apparatus of this invention.

FIG. 6 illustrates a desirable dispense of the photoresist measured by the apparatus described in this invention. The sensor response shows dispenses which range in duration from 0.25 to 3 seconds.

Figure 7:
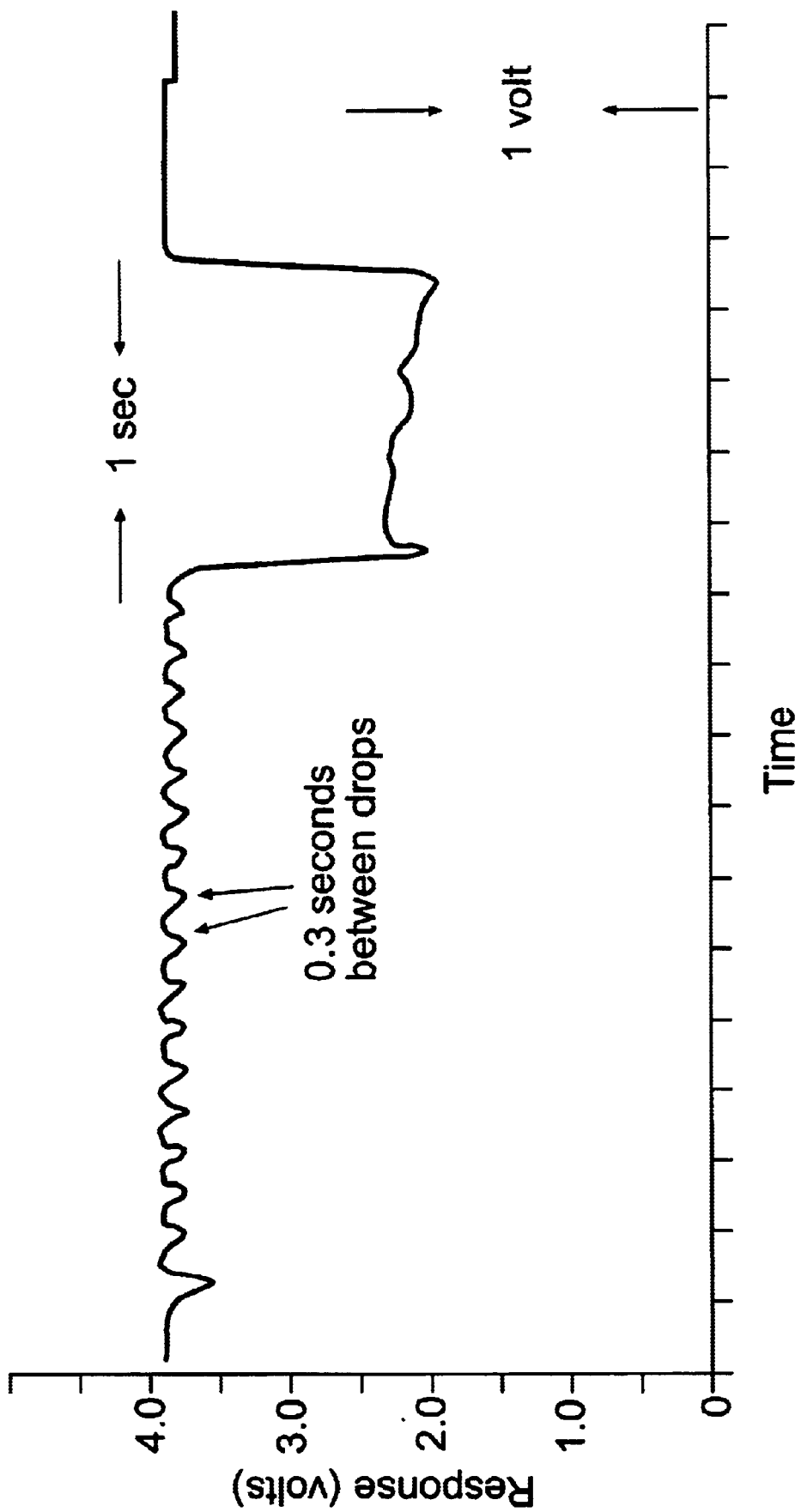
FIG. 7 is an example of an unsatisfactory dispense as measured by the apparatus of this invention.

FIG. 7 illustrates an undesirable dispense containing an irregular stream of fluid followed by plurality of drops characteristic of an undesirable dispense. Comparison of FIGS. 6 and 7 provide means for determining that the dispense illustrated in FIG. 7 is unacceptable in terms of its shape and timing compared to those in FIG. 6.

Figure 8:
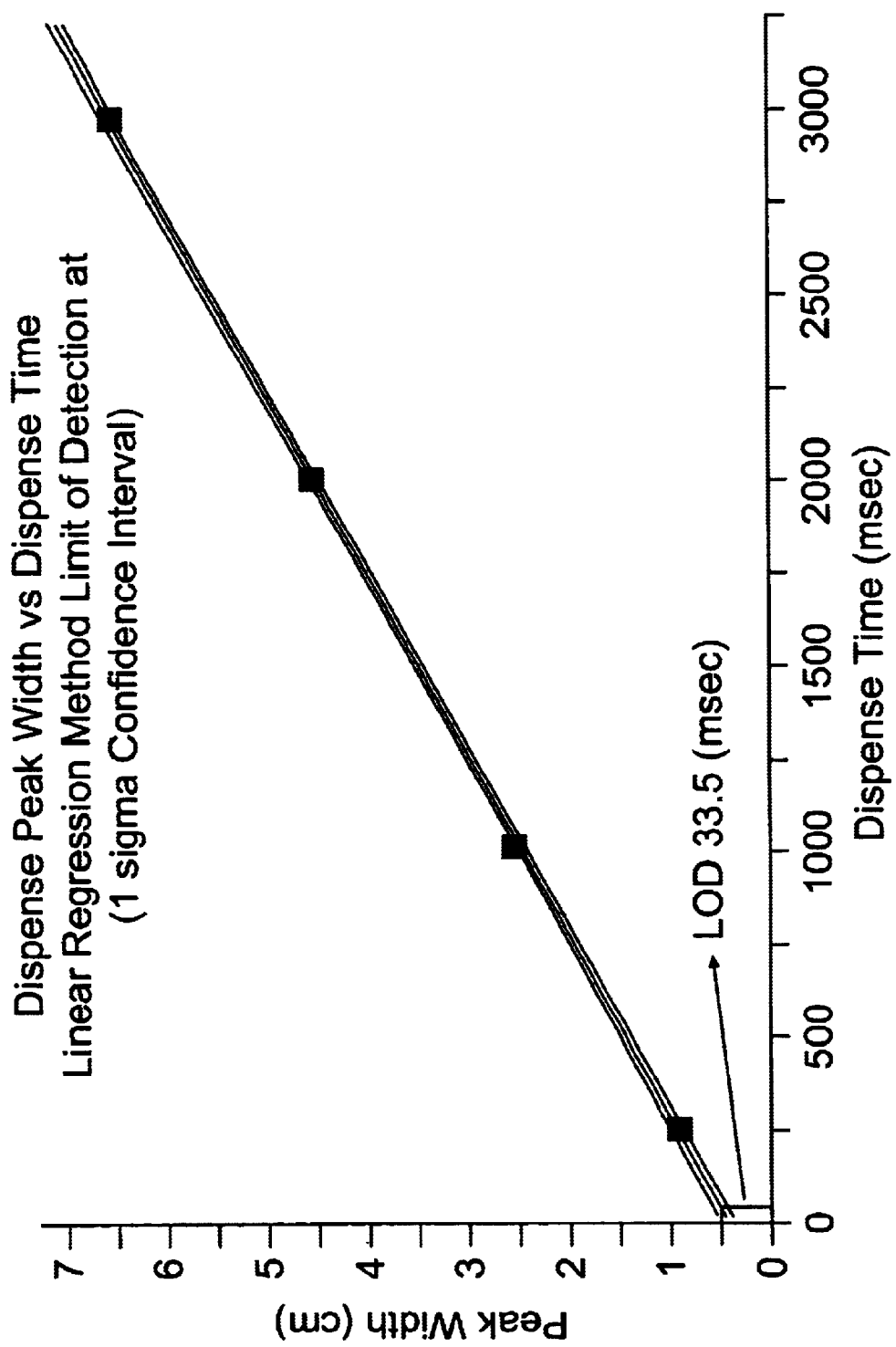
FIG. 8 is a plot to determine the sensitivity of the apparatus of this invention to distinguish between dispenses of different duration.

FIG. 8 is a graph of different dispenses shown in FIG. 6 plotted against the time for the dispense. A least squares regression of this data illustrates that at the 1 sigma confidence interval, the ability of the apparatus of this invention in Example 1 is able to distinguish between the duration of different dispenses to within 33 milliseconds.

It is to be understood that these are examples of the apparatus of the invention described. Suitable modifications to the device, including but not limited to high-speed timing equipment and other sensors would be obvious to those skilled in the art.

We claim:

1. The process for determining the acceptability of a fluid dispense which comprises:
   providing a dispenser for dispensing a volume of fluid comprising said fluid dispense from a container containing said fluid and dispensing the discrete fluid volume from the container through the dispenser,
   illuminating said volume of fluid prior to said volume of fluid contacting a substrate with energy from an emitter,
   detecting energy transmitted from said volume of fluid to identify a shape of said fluid dispense, and
   comparing said shape with a previously identified standard shape to determine acceptability of said fluid dispense.

2. The process of claim 1 wherein the detecting of energy transmitted from said volume of fluid is used to determine the time at which fluid flow from the dispenser started and when it stopped.

3. The process of claim 1 wherein said steps of illuminating and detecting are conducted at least twice.

4. The process of claim 1 wherein said steps of illuminating and detecting are conducted by measuring the reflected energy from the surface onto which said volume of fluid is dispensed.

5. The process of claim 1 wherein the one or more energy sources are selected from the group consisting of thermal, acoustic and electromagnetic energy.

6. The process of claim 1 wherein the one or more energy sources is light.

7. The process of claim 1 wherein the receipt of a signal from a source of energy reacting to the column of fluid being dispensed is used to determine the time at which the dispense stopped and is used to control one or more stop-suck back valves on the dispenser.

8. The process of claim 1 wherein the shape is used to determine the time at which the dispense stopped and is used to control a spinner spindle of process equipment in communication with the dispenser.

9. The process of claim 1 wherein the shape is used to determine the time at which the dispense stopped and is used to control the timing of subsequent dispenses by the dispenser.

10. The system for determining the acceptability of a fluid dispense which comprises:

a dispenser for dispensing a volume of fluid from a container containing said fluid, one or more energy sources for illuminating said volume of fluid prior to said volume of fluid contacting a substrate with energy one or more sensors for detecting energy transmitted from said volume of fluid to identify a shape of said fluid dispense, and means for comparing said shape with a previously identified shape to determine acceptability of said fluid dispense.

11. The system of claim 10 wherein the sensors for detecting energy transmitted from said volume of fluid and the means for comparing said shape are used to determine the time at which fluid flow from the dispenser started and when it stopped.

12. The system of claim 10 wherein the one or more energy sources is a plurality of energy sources for illuminating and the one or more sensors is a plurality of sensors for detecting.

13. The system of claim 10 wherein the one or more energy sources are selected from the group consisting of thermal, acoustic and electromagnetic energy.

14. The system of claim 10 wherein the one or more energy sources is light.

15. The system of claim 10 wherein the sensors for detecting the energy collected from said energy source from said volume of fluid dispensed are used to determine the time at which fluid from the dispenser started and when it stopped.

16. The system of claim 10 wherein the shape from the sensor indicates the end of fluid dispense and is used to control one or more stop suck-back valves and a spinner spindle of process equipment in communication with the dispenser, and the timing of subsequent dispenses by said dispenser.

17. The system of claim 10 wherein the shape from the sensor indicates the end of the fluid dispense is used to control the spinner spindle of the process equipment in communication with the dispenser.

18. The system of claim 10 wherein the shape from the sensor indicates the end of the fluid dispense and is used to control the timing of subsequent dispenses by the dispenser.

19. A system as in claim 10 wherein the said system is used to calibrate a dispenser to have a proper dispense.

20. The process for determining the acceptability of a fluid dispense for coating a substrate in a second process with a process equipment for modifying said substrate, said process comprising the steps of:

dispensing a volume of fluid comprising said fluid from a container containing said fluid onto said substrate, illuminating said volume of fluid prior to said volume of fluid contacting a substrate with energy from an energy emitter, detecting energy transmitted from said volume of liquid to identify a shape of said fluid dispense, comparing said shape and timing of the dispense with a previously identified standard shape or response output to determine the acceptability of said fluid dispense and dispense timing, and removing said substrate from said process equipment when the fluid dispense is determined to be unacceptable.

21. The process of claim 20 wherein said steps of illuminating and detecting are conducted at least twice.

22. The process of claim 20 wherein the one or more energy sources are selected from the group consisting of thermal, acoustic and electromagnetic energy.

23. The process of claim 20 wherein the one or more energy sources is light.

24. The process of claim 20 wherein the shape is used to determine the time at which the dispense stopped and is used to control a spinner spindle of said process equipment.

* * * * *